United States Patent
Hao

(10) Patent No.: US 9,858,876 B2
(45) Date of Patent: Jan. 2, 2018

(54) DRIVING CIRCUIT AND SHIFT REGISTER CIRCUIT

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Sikun Hao, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 67 days.

(21) Appl. No.: 14/888,427

(22) PCT Filed: Aug. 25, 2015

(86) PCT No.: PCT/CN2015/088020
§ 371 (c)(1),
(2) Date: Oct. 31, 2015

(87) PCT Pub. No.: WO2017/028328
PCT Pub. Date: Feb. 23, 2017

(65) Prior Publication Data
US 2017/0162141 A1 Jun. 8, 2017

(51) Int. Cl.
G09G 3/36 (2006.01)
G11C 19/28 (2006.01)
H03K 3/012 (2006.01)

(52) U.S. Cl.
CPC ......... *G09G 3/3625* (2013.01); *G09G 3/3648* (2013.01); *G09G 3/3688* (2013.01);
(Continued)

(58) Field of Classification Search
CPC .. G09G 3/3625; G09G 3/3688; G09G 3/3648; G09G 2310/0264; H03K 3/012; G11C 19/28
See application file for complete search history.

(56) References Cited

U.S. PATENT DOCUMENTS

2004/0135611 A1\* 7/2004 Tohsche ............... H03K 3/0372
327/218
2004/0150610 A1\* 8/2004 Zebedee ................ G11C 19/28
345/100

(Continued)

FOREIGN PATENT DOCUMENTS

KR 20120044771 A 5/2012

*Primary Examiner* — Premal Patel
(74) *Attorney, Agent, or Firm* — Andrew C. Cheng

(57) ABSTRACT

The present invention proposes a driving circuit and a shift register. The driving circuit includes shift register circuits disposed in cascade. Each of shift register circuits includes a clock control transmittance circuit and a latch circuit. The clock control transmittance circuit is triggered by a first clock pulse. A driving pulse of a Q node at previous two stages is transmitted to the latch circuit and latched by the latch circuit. Further, the latch circuit is triggered by a second clock pulse, and then a gate driving pulse and a driving pulse of the Q node is output. So the present invention can be used in the CMOS process owing to the features of low consumption and wide noise margin.

13 Claims, 6 Drawing Sheets

(52) U.S. Cl.
CPC .............. *G11C 19/28* (2013.01); *H03K 3/012* (2013.01); *G09G 2310/0264* (2013.01)

(56) References Cited

U.S. PATENT DOCUMENTS

| | | | |
|---|---|---|---|
| 2005/0018807 A1* | 1/2005 | Han | G11C 8/04 377/69 |
| 2006/0158419 A1* | 7/2006 | Li | G11C 19/00 345/100 |
| 2008/0007320 A1* | 1/2008 | Lu | H05B 33/0842 327/518 |
| 2008/0062113 A1* | 3/2008 | Kim | G09G 3/3688 345/100 |
| 2011/0298771 A1 | 12/2011 | Yoo | |
| 2012/0081346 A1* | 4/2012 | Furuta | G11C 19/28 345/209 |
| 2013/0136224 A1* | 5/2013 | Qing | G11C 19/28 377/64 |
| 2014/0049712 A1* | 2/2014 | Yu | G02F 1/13306 349/34 |
| 2015/0277657 A1* | 10/2015 | Azumi | G06F 3/0416 345/174 |
| 2016/0180964 A1* | 6/2016 | Hu | G11C 19/28 345/100 |
| 2016/0307533 A1 | 10/2016 | Cao | |
| 2016/0335962 A1 | 11/2016 | Xiao | |
| 2016/0343310 A1 | 11/2016 | Hao | |
| 2016/0343451 A1 | 11/2016 | Hao | |
| 2017/0040068 A1 | 2/2017 | Hao | |

\* cited by examiner

DRIVING CIRCUIT AND SHIFT REGISTER CIRCUIT

BACKGROUND OF THE INVENTION

1. Field of the Invention

The present invention relates to the field of liquid crystal display, and more particularly, to a driving circuit and a shift register circuit.

2. Description of the Prior Art

To realize to drive the scanning, a gate scanning driving circuit is arranged on an array substrate in the process of manufacturing an array for making a conventional liquid crystal display (LCD) for producing a gate driver on array (GOA). The GOA circuit has advantages of lower production costs and narrow bezel design, so it is widely used in many types of displays. The GOA circuit has two basic functions. The first function is that a gate driving pulse is input to a gate line in the driving panel, a thin film transistor (TFT) is turned on in the display section, and pixels are charged via the gate line. The second function is that a shift register can be used. After the nth gate driving pulse is output, the n+1th gate driving pulse is controlled to be output by a clock. Such an act is past on afterwards.

The GOA circuit comprises a pull-up circuit, a pull-up control circuit, a pull-down circuit, a pull-down control circuit, and a boost circuit used for boosting electric levels. Specifically, the pull-up circuit is used for outputting an input clock signal to a gate of a thin-film transistor (TFT) and used as a driving signal of the LCD. The pull-up control circuit is used for controlling the turn-up of the pull-up circuit. Signals are usually transmitted from the upper-stage GOA circuit. The pull-down circuit is used for pulling a scanning signal down rapidly after the scanning signal is output so that the scanning signal can be at a low electric level; that is, the gate of the TFT is pulled down to be the gate at a low electric level. A pull-down maintain circuit is used for maintaining the scanning signal and a signal (usually named Q node) for the pull-up circuit closed (set to be a negative electric level). In general, two pull-down maintain circuits are used to keep alternations of the circuits. The boost circuit is used for boosting the electric level of the Q node the second time to ensure that G(N) for the pull-up circuit can be output normally.

Different processes are conducted based on different GOA circuits. The low temperature poly-silicon (LTPS) process has advantages of high electron mobility and mature technique and is widely used in small-medium size displays. The complementary metal oxide semiconductor (CMOS) LTPS process has advantages of low power consumption, high electron mobility, and wide noise margin. On the contrary, the conventional GOA circuit process cannot be used on the CMOS process because the conventional GOA circuit process consumes more power.

SUMMARY OF THE INVENTION

The present invention proposes a driving circuit and a shift register circuit for being used in the CMOS process owing to the features of low consumption and wide noise margin.

According to the present invention, a driving circuit comprises a plurality of shift register circuits disposed in cascade. Each of the plurality of shift register circuits comprises a clock control transmittance circuit and a latch circuit. The clock control transmittance circuit is triggered by a first clock pulse. A driving pulse of a Q node at previous two stages is transmitted to the latch circuit and latched by the latch circuit. Further, the latch circuit is triggered by a second clock pulse, and then a gate driving pulse and a driving pulse of the Q node is output. The clock control transmittance circuit and the latch circuit are rising edge-triggered. The latch circuit comprises a first transmission gate, a second transmission gate, a first inverter, a second inverter, and an NOR gate. A first controlling terminal of the first transmission gate and a second controlling terminal of the second transmission gate are connected to an output terminal of the clock control transmittance circuit. An input terminal of the first transmission gate is connected to a Q node at the previous two stages. A second controlling terminal of the first transmission gate and a first controlling terminal of the second transmission gate both are connected to the first clock pulse. An output terminal of the first transmission gate is connected to an input terminal of the second transmission gate and an input terminal of the first inverter. An output terminal of the first inverter is connected to an input terminal of the second inverter. An output terminal of the second inverter and an output terminal of the second transmission gate both are connected to a first input terminal of the NOR gate. A second input terminal of the NOR gate is connected to the second clock pulse.

Furthermore, the clock control transmittance circuit inverts the first clock pulse when the clock control transmittance circuit transmits the first clock pulse.

Furthermore, the output terminal of the second inverter outputs a driving pulse of the Q node.

Furthermore, the latch circuit further comprises a multi-stage inverting circuit which an output terminal of the NOR gate is connected to.

Furthermore, the multi-stage inverting circuit comprises three inverters.

Furthermore, the input terminal of the first transmission gate is connected to a short-term variability (STV) pulse in the shift register circuit at the first stage and the shift register circuit at the second stage.

According to the present invention, a driving circuit comprises a plurality of shift register circuits disposed in cascade. Each of the plurality of shift register circuits comprises a clock control transmittance circuit and a latch circuit. The clock control transmittance circuit is triggered by a first clock pulse. A driving pulse of a Q node at previous two stages is transmitted to the latch circuit and latched by the latch circuit. Further, the latch circuit is triggered by a second clock pulse, and then a gate driving pulse and a driving pulse of the Q node is output.

Furthermore, the clock control transmittance circuit and the latch circuit are rising edge-triggered.

Furthermore, the latch circuit comprises a first transmission gate, a second transmission gate, a first inverter, a second inverter, and an NOR gate. A first controlling terminal of the first transmission gate and a second controlling terminal of the second transmission gate are connected to an output terminal of the clock control transmittance circuit. An input terminal of the first transmission gate is connected to a Q node at the previous two stages. A second controlling terminal of the first transmission gate and a first controlling terminal of the second transmission gate both are connected to the first clock pulse. An output terminal of the first transmission gate is connected to an input terminal of the second transmission gate and an input terminal of the first inverter. An output terminal of the first inverter is connected to an input terminal of the second inverter. An output terminal of the second inverter and an output terminal of the second transmission gate both are connected to a first input terminal of the NOR gate. A second input terminal of the NOR gate is connected to the second clock pulse.

Furthermore, the clock control transmittance circuit inverts the first clock pulse when the clock control transmittance circuit transmits the first clock pulse.

Furthermore, the output terminal of the second inverter outputs a driving pulse of the Q node.

Furthermore, the latch circuit further comprises a multi-stage inverting circuit which an output terminal of the NOR gate is connected to.

Furthermore, the multi-stage inverting circuit comprises three inverters.

Furthermore, the input terminal of the first transmission gate is connected to a short-term variability (STV) pulse in the shift register circuit at the first stage and the shift register circuit at the second stage.

According to the present invention, a shift register circuits comprises a clock control transmittance circuit and a latch circuit. The clock control transmittance circuit is triggered by a first clock pulse. A driving pulse of a Q node at previous two stages is transmitted to the latch circuit and latched by the latch circuit. Further, the latch circuit is triggered by a second clock pulse, and then a gate driving pulse and a driving pulse of the Q node is output.

Compared with the conventional technology, a clock control transmittance circuit is triggered by a first clock pulse of a clock signal in the present invention. A driving pulse of a Q node at previous two stages is transmitted to a latch circuit and then latched by the latch circuit. Further, the latch circuit is triggered by a second clock pulse, and then a driving pulse is output. So the present invention can be used in the CMOS process owing to the features of low consumption and wide noise margin.

BRIEF DESCRIPTION OF THE DRAWINGS

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

DETAILED DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1:
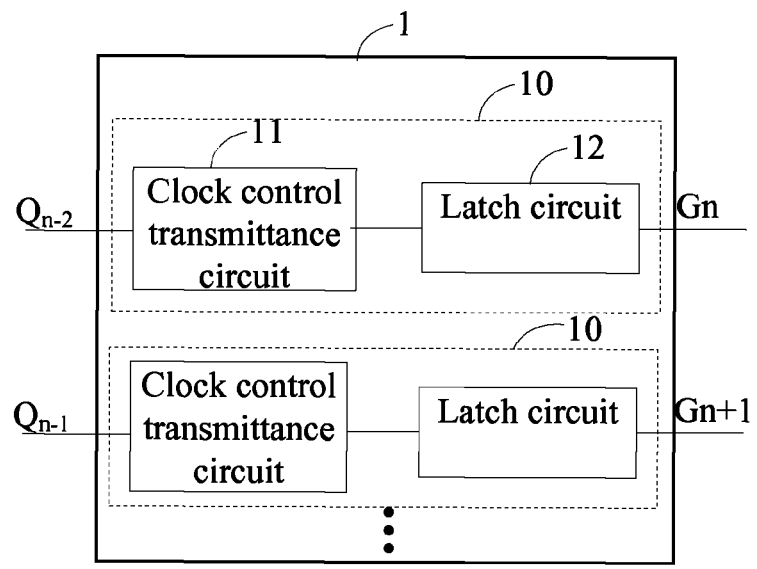
FIG. 1 shows a block diagram of a driving circuit according to a preferred embodiment of the present invention.

Please refer to FIG. 1. FIG. 1 is a schematic diagram of a driving circuit 1 according to one embodiment of the present invention. The driving circuit 1 comprises a plurality of shift register circuits 10 disposed in cascade. Each of the plurality of shift register circuits 10 comprises a clock control transmittance circuit 11 and an NOR gate latch circuit 12. The clock control transmittance circuit 11 is triggered by a first clock pulse. A driving pulse $Q_{n-2}$ of a Q node at previous two stages is transmitted to the NOR gate latch circuit 12 and is latched by the NOR gate latch circuit 12. Further, the NOR gate latch circuit 12 is triggered by a second clock pulse, and then a driving pulse is output. The clock control transmittance circuit 11 inverts the first clock pulse when transmitting the first clock pulse. Also, the clock control transmittance circuit 11 and the NOR gate latch circuit 12 are rising edge-triggered. In this invention, the clock control transmittance circuit 11 controls the transmittance of signals, and the NOR gate latch circuit 12 latches the signals, so the present invention applies to the CMOS process owing to the features of low consumption and wide noise margin.

Figure 2:
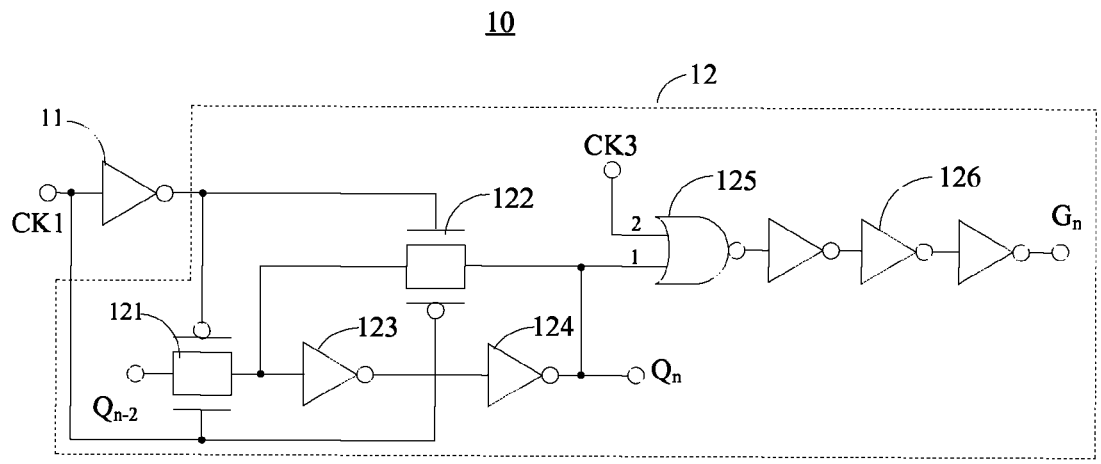
FIG. 2 shows a circuit diagram of a shift register circuit shown in FIG. 1.

Preferably, the clock control transmittance circuit 11 is an inverter. As FIG. 2 shows, the NOR gate latch circuit 12 at least comprises a first transmission gate 121, a second transmission gate 122, a first inverter 123, a second inverter 124, an NOR gate 125, and a multi-stage inverting circuit 126. A first controlling terminal of the first transmission gate 121 and a second controlling terminal of the second transmission gate 122 are connected to an output terminal of the clock control transmittance circuit 11. An input terminal of the first transmission gate 121 is connected to a Q node $Q_{n-2}$ at previous two stages. A second controlling terminal of the first transmission gate 121 and a first controlling terminal of the second transmission gate 122 are connected to a first clock pulse CK1. An output terminal of the first transmission gate 121 is connected to an input terminal of the second transmission gate 122 and an input terminal of the first inverter 123. An output terminal of the first inverter 123 is connected to an input terminal of the second inverter 124. An output terminal of the second inverter 124 and an output terminal of the second transmission gate 122 both are connected to a first input terminal of the NOR gate 125. A second input terminal of the NOR gate 125 is connected to a second clock pulse CK3. The multi-stage inverting circuit 126 is connected to an output terminal of the NOR gate 125 for improving the driving capacity of the driving circuit 1. Preferably, the multi-stage inverting circuit 126 comprises three inverters connected in series. The output terminal of the second inverter 124 outputs a driving pulse $Q_n$ of the Q node. An output terminal of the multi-stage inverting circuit 126 outputs a driving pulse $G_n$. The "n" in $Q_n$ and $G_n$ is defined as an integral equal to or larger than one.

Figure 3:
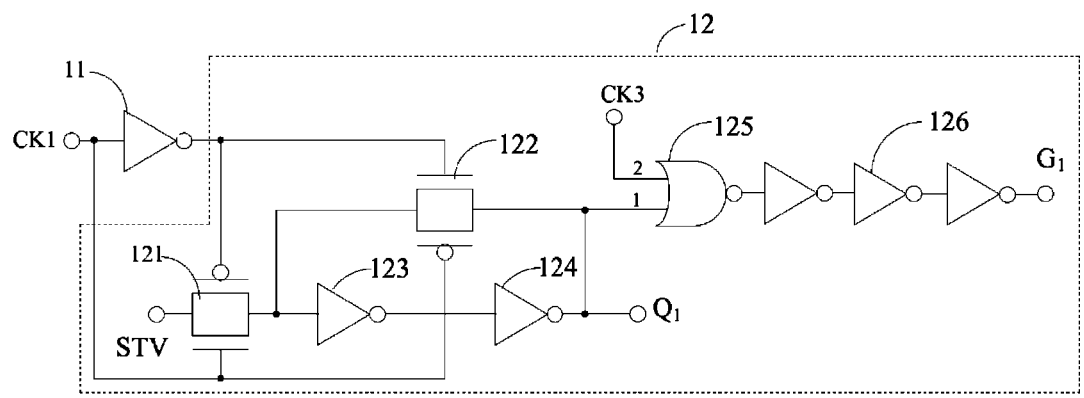
FIG. 3 shows a circuit diagram of a first stage shift register circuit shown in FIG. 1.
Figure 4:
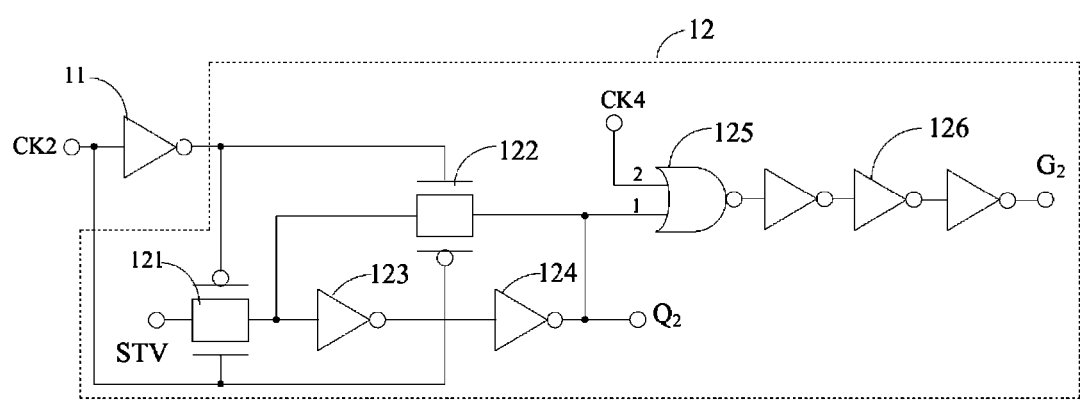
FIG. 4 shows a circuit diagram of a second stage shift register circuit shown in FIG. 1.

The driving circuit 1 comprises a shift register circuit 10 at an onset stage and a shift register circuit 10 at an ordinary stage. The shift register circuit 10 at an onset stage comprises a shift register circuit 10 at a first stage and a shift register circuit 10 at a second stage. As FIG. 3 shows, the first clock pulse is the clock pulse CK1, the second clock pulse is the clock pulse CK3, the input terminal of the first transmission gate 121 is connected to a short-term variability (STV) pulse, the output terminal of the second inverter 124 outputs a driving pulse $Q_1$ of the Q node at the first stage, and the output terminal of the multi-stage inverting circuit 126 outputs a driving pulse $G_1$ at the first stage in the shift register circuit 10 at the first stage. As FIG. 4 shows, the first clock pulse is the clock pulse CK2, the second clock pulse is the clock pulse CK4, the input terminal of the first transmission gate 121 is connected to the STV pulse, the output terminal of the second inverter 124 outputs a driving pulse $Q_2$ of the Q node at the second stage, and the output terminal of the multi-stage inverting circuit 126 outputs a driving pulse $G_2$ at the second stage in the shift register circuit 10 at the second stage. Preferably, the STV pulse is an onset controlling signal.

Figure 5:
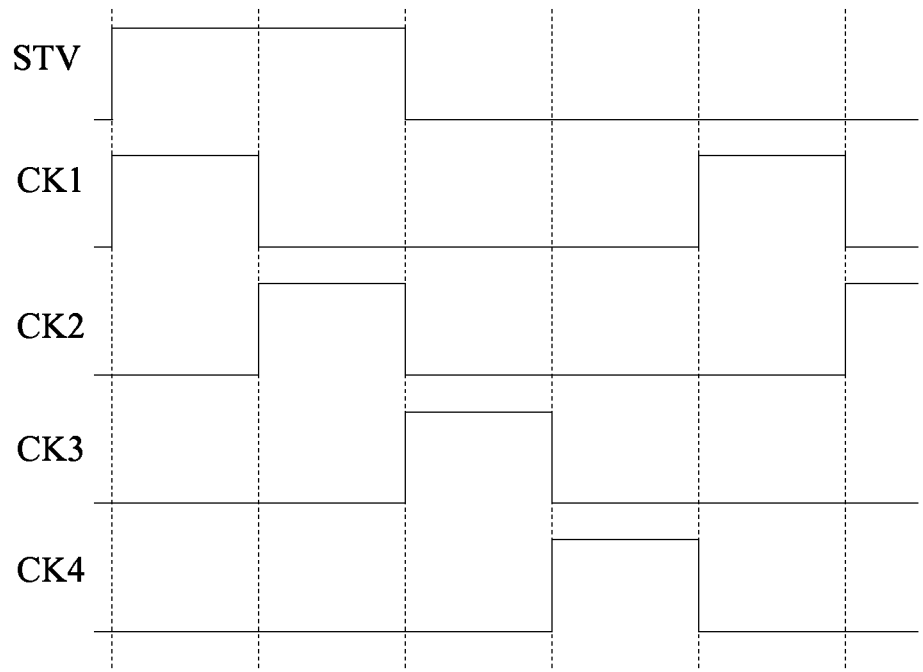
FIG. 5 shows a timing diagram of ideal waveforms applied in the first and second stage shift register circuits shown in FIG. 1.

FIG. 5 is a theoretical timing diagram of the STV pulse and the clock pulses CK1, CK2, CK3, and CK4. The vertical coordinate defines voltage, and the horizontal coordinate defines time. In the shift register circuit 10 at the first stage, the clock control transmittance circuit 11 triggers the first transmission gate 121 to conduct and the second transmission gate 122 to disconnect when the clock pulse CK1 is at rising edge. The first transmission gate 121 transmits the STV pulse to the first inverter 123 and then to the driving pulse $Q_1$ of the Q node at the first stage through the second inverter 124. The STV pulse is at a high electric level. The driving pulse $Q_1$ of the Q node is also at a high electric level. The clock pulse CK3 triggers the NOR gate 125 of the driving circuit 1 when the clock pulse CK3 is at rising edge. The driving pulse $Q_1$ of the Q node is transmitted to the driving pulse $G_1$ at the first stage through the NOR gate 125 and the multi-stage inverting circuit 126. The driving pulse $G_1$ is also at a high electric level. In the shift register circuit 10 at the second stage, the clock control transmittance circuit 11 triggers the first transmission gate 121 to conduct and the second transmission gate 122 to disconnect when the clock pulse CK2 is at rising edge. The first transmission gate 121 transmits the STV pulse to the first inverter 123 and then to the driving pulse $Q_2$ of the Q node at the second stage through the second inverter 124. The STV pulse is at a high electric level. The driving pulse $Q_2$ of the Q node is also at a high electric level. The clock pulse CK4 triggers the NOR gate 125 of the driving circuit 1 when the clock pulse CK4 is at rising edge. The driving pulse $Q_2$ of the Q node is transmitted to the driving pulse $G_2$ at the second stage through the NOR gate 125 and the multi-stage inverting circuit 126. The driving pulse $G_2$ is also at a high electric level.

Figure 6:
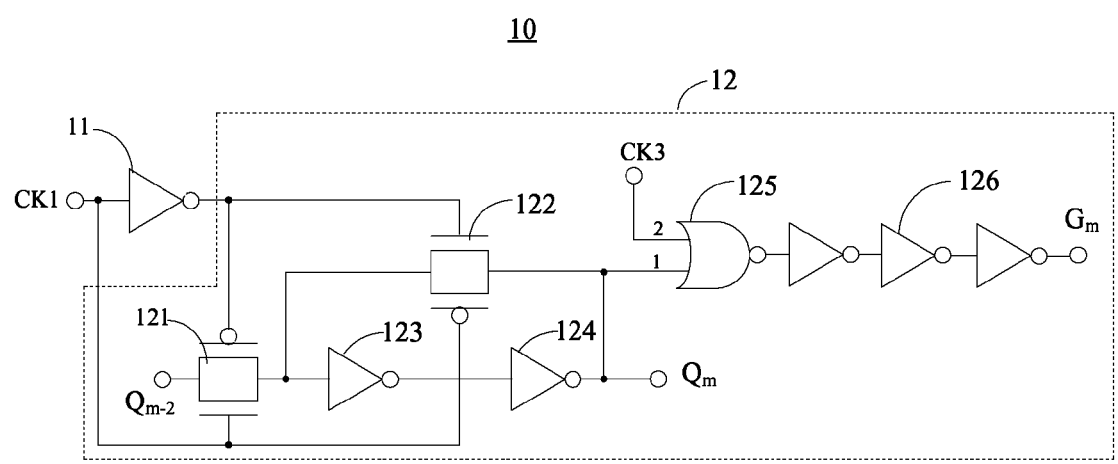
FIG. 6 shows a circuit diagram of an mth stage shift register circuit shown in FIG. 1.

The shift register circuit 10 at the ordinary stage is the shift register circuit 10 at the third stage or the shift register circuit 10 at higher than the third stage. As FIG. 6 shows, the first clock pulse is the clock pulse CK1 in the shift register circuit 10 at the mth stage where "m" means "n" larger than or equal to three. Also, the second clock pulse is the clock pulse CK3. The input terminal of the first transmission gate 121 is connected to the Q node $Q_{m-2}$ at the previous two stages. The output terminal of the second inverter 124 outputs the driving pulse $Q_m$ of the Q node at the mth stage. The output terminal of the multi-stage inverting circuit 126 outputs the driving pulse $G_m$ at the mth stage.

Figure 7:
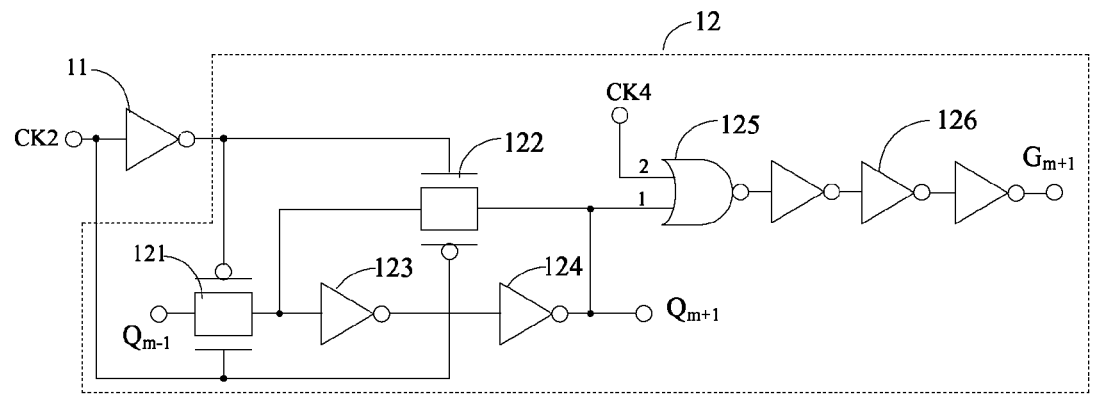
FIG. 7 shows a circuit diagram of an (m+1)th stage shift register circuit shown in FIG. 1.

As FIG. 7 shows, the first clock pulse is the clock pulse CK2 in the shift register circuit 10 at the m+1 stage. Also, the second clock pulse is the clock pulse CK4. The input terminal of the first transmission gate 121 is connected to the Q node $Q_{m-1}$ at the previous two stages. The output terminal of the second inverter 124 outputs the driving pulse $Q_{m+1}$ of the Q node at the m+1th stage. The output terminal of the multi-stage inverting circuit 126 outputs the driving pulse $G_{m+1}$ at the m+1th stage.

Figure 8:
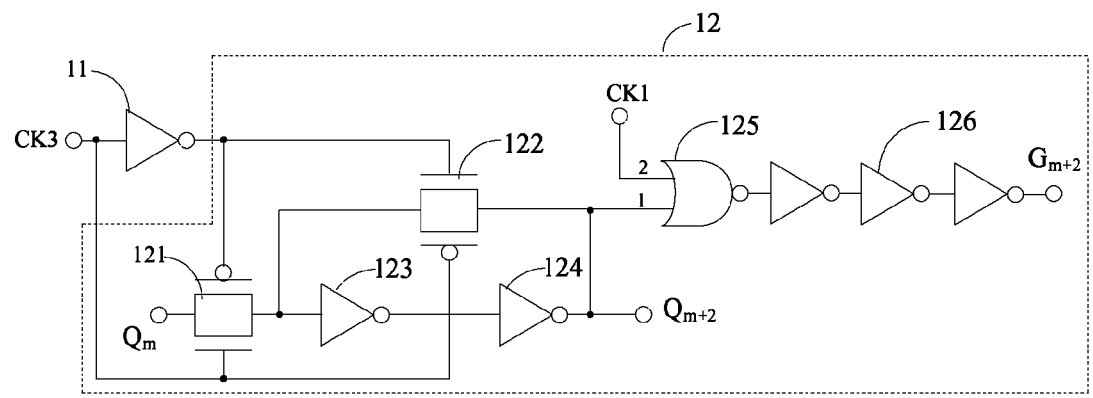
FIG. 8 shows a circuit diagram of an (m+2)th stage shift register circuit shown in FIG. 1.

As FIG. 8 shows, the first clock pulse is the clock pulse CK3 in the shift register circuit 10 at the m+2 stage. Also, the second clock pulse is the clock pulse CK1. The input terminal of the first transmission gate 121 is connected to the Q node $Q_m$ at the previous two stages. The output terminal of the second inverter 124 outputs the driving pulse $Q_{m+2}$ of the Q node at the m+2th stage. The output terminal of the multi-stage inverting circuit 126 outputs the driving pulse $G_{m+2}$ at the m+2th stage.

Figure 9:
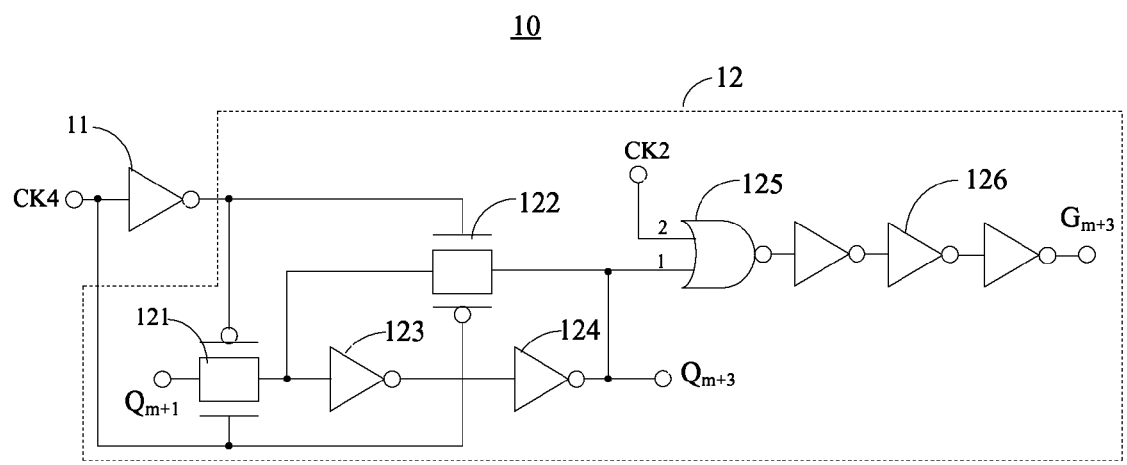
FIG. 9 shows a circuit diagram of an (m+3)th stage shift register circuit shown in FIG. 1.

As FIG. 9 shows, the first clock pulse is the clock pulse CK4 in the shift register circuit 10 at the m+3 stage. Also, the second clock pulse is the clock pulse CK2. The input terminal of the first transmission gate 121 is connected to the Q node $Q_{m+1}$ at the previous two stages. The output terminal of the second inverter 124 outputs the driving pulse $Q_{m+3}$ of the Q node at the m+3th stage. The output terminal of the multi-stage inverting circuit 126 outputs the driving pulse $G_{m+3}$ at the m+3th stage.

Figure 10:
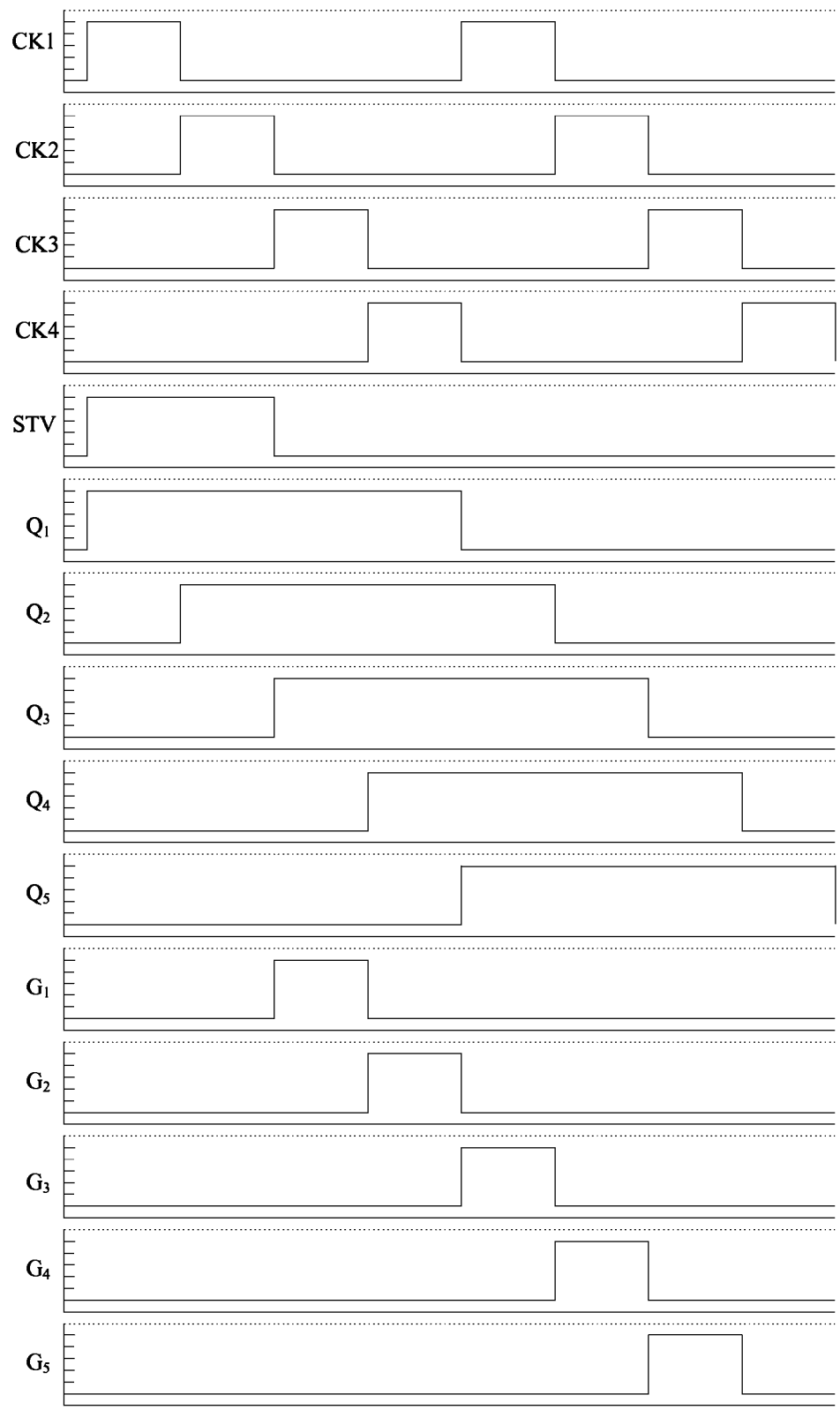
FIG. 10 shows a timing diagram of waveforms applied in the driving circuits according to a preferred embodiment of the present invention.

FIG. 10 is a simulated timing diagram of the driving circuit according to this embodiment of the present invention. The vertical coordinate defines voltage, and the horizontal coordinate defines time. FIG. 10 shows that the simulation from the shift register circuit 10 at the first stage to the STV impulse of the shift register circuit 10 at the fifth stage, the simulation of the clock pulses CK1, CK2, CK3, and CK4, and the simulation of the driving pulses of the Q node $Q_1$, $Q_2$, $Q_3$, $Q_4$, and $Q_5$, and the simulation of the driving pulses $G_1$, $G_2$, $G_3$, $G_4$, and $G_5$. It can be inferred from FIG. 10 that the simulated timing of the driving circuit of the NOR gate latch is the same as the theoretical timing shown in FIG. 5.

The present invention further proposes a shift register circuit with an NOR gate latch 10. The shift register circuit with an NOR gate latch 10 comprises a clock control transmittance circuit 11 and an NOR gate latch circuit 12. As FIG. 2 shows, the NOR gate latch circuit 12 at least comprises a first transmission gate 121, a second transmission gate 122, a first inverter 123, a second inverter 124, an NOR gate 125, and a multi-stage inverting circuit 126. A first controlling terminal of the first inverter 123 and a second controlling terminal of the second transmission gate 122 are connected to an output terminal of the clock control transmittance circuit 11. An input terminal of the first transmission gate 121 is connected to a Q node $Q_{n-2}$ at previous two stages. A second controlling terminal of the first transmission gate 121 and a first controlling terminal of the second transmission gate 122 both are connected to a first clock pulse. An output terminal of the first transmission gate 121 is connected to an input terminal of the second transmission gate 122 and an input terminal of the first inverter 123. An output terminal of the first inverter 123 is connected to an input terminal of the second inverter 124. An output terminal of the second inverter 124 and an output terminal of the second transmission gate 122 both are connected to a first input terminal of the NOR gate 125. A second input terminal of the NOR gate 125 is connected to a second clock pulse. The multi-stage inverting circuit 126 is connected to an output terminal of the NOR gate 125 for improving the driving capacity of the driving circuit 1. Preferably, the multi-stage inverting circuit 126 comprises three inverters connected in series. The output terminal of the second inverter 124 outputs a driving pulse $Q_n$ of the Q node. An output terminal of the multi-stage inverting circuit 126 outputs a driving pulse $G_n$. The "n" in $Q_n$ and $G_n$ is defined as an integral equal to or larger than one.

Preferably, the driving pulse introduced by the present invention is a gate driving pulse.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A driving circuit, comprising a plurality of shift register circuits disposed in cascade, each of the plurality of shift register circuits comprising a clock control transmittance circuit and a latch circuit, the clock control transmittance circuit being triggered by a first clock pulse, a driving pulse of a Q node at previous two stages being transmitted to the latch circuit and latched by the latch circuit, further, the latch circuit being triggered by a second clock pulse, and then a gate driving pulse and a driving pulse of the Q node being output, and the clock control transmittance circuit and the latch circuit being rising edge-triggered;

wherein the latch circuit at least comprises a first transmission gate, a second transmission gate, a first inverter, a second inverter, and an NOR gate; a first controlling terminal of the first transmission gate and a second controlling terminal of the second transmission gate are connected to an output terminal of the clock control transmittance circuit; an input terminal of the first transmission gate is connected to a Q node at the previous two stages, a second controlling terminal of the first transmission gate and a first controlling terminal of the second transmission gate both are connected to the first clock pulse; an output terminal of the first transmission gate is connected to an input terminal of the second transmission gate and an input terminal of the first inverter; an output terminal of the first inverter is connected to an input terminal of the second inverter; an output terminal of the second inverter and an output terminal of the second transmission gate both are connected to a first input terminal of the NOR gate; and a second input terminal of the NOR gate is connected to the second clock pulse.

2. The driving circuit of claim 1, wherein the clock control transmittance circuit inverts the first clock pulse when the clock control transmittance circuit transmits the first clock pulse.

3. The driving circuit of claim 1, wherein the output terminal of the second inverter outputs a driving pulse of the Q node.

4. The driving circuit of claim 1, wherein the latch circuit further comprises a multi-stage inverting circuit which an output terminal of the NOR gate is connected to.

5. The driving circuit of claim 4, wherein the multi-stage inverting circuit comprises three inverters.

6. The driving circuit of claim 1, wherein the input terminal of the first transmission gate is connected to a short-term variability (STV) pulse in the shift register circuit at the first stage and the shift register circuit at the second stage.

7. A driving circuit, comprising a plurality of shift register circuits disposed in cascade, each of the plurality of shift register circuits comprising a clock control transmittance circuit and a latch circuit, the clock control transmittance circuit being triggered by a first clock pulse, a driving pulse of a Q node at previous two stages being transmitted to the latch circuit and latched by the latch circuit, further, the latch circuit being triggered by a second clock pulse, and then a gate driving pulse and a driving pulse of the Q node being output, wherein the latch circuit at least comprises a first transmission gate, a second transmission gate, a first inverter, a second inverter, and an NOR gate; a first controlling terminal of the first transmission gate and a second controlling terminal of the second transmission gate are connected to an output terminal of the clock control transmittance circuit; an input terminal of the first transmission gate is connected to a Q node at the previous two stages, a second controlling terminal of the first transmission gate and a first controlling terminal of the second transmission gate both are connected to the first clock pulse; an output terminal of the first transmission gate is connected to an input terminal of the second transmission gate and an input terminal of the first inverter; an output terminal of the first inverter is connected to an input terminal of the second inverter; an output terminal of the second inverter and an output terminal of the second transmission gate both are connected to a first input terminal of the NOR gate; and
a second input terminal of the NOR gate is connected to the second clock pulse.

8. The driving circuit of claim 7, wherein the clock control transmittance circuit and the latch circuit are rising edge-triggered.

9. The driving circuit of claim 7, wherein the clock control transmittance circuit inverts the first clock pulse when the clock control transmittance circuit transmits the first clock pulse.

10. The driving circuit of claim 7, wherein the output terminal of the second inverter outputs a driving pulse of the Q node.

11. The driving circuit of claim 7, wherein the latch circuit further comprises a multi-stage inverting circuit which an output terminal of the NOR gate is connected to.

12. The driving circuit of claim 11, wherein the multi-stage inverting circuit comprises three inverters.

13. The driving circuit of claim 7, wherein the input terminal of the first transmission gate is connected to a short-term variability (STV) pulse in the shift register circuit at the first stage and the shift register circuit at the second stage.

* * * * *